United States Patent [19]
Choudhury

[11] Patent Number: 5,525,837
[45] Date of Patent: Jun. 11, 1996

[54] RELIABLE METALLIZATION WITH BARRIER FOR SEMICONDUCTORS

[75] Inventor: Ratan K. Choudhury, Milpitas, Calif.

[73] Assignee: LSI Logic Corporation, Milpitas, Calif.

[21] Appl. No.: 463,064

[22] Filed: Jun. 5, 1995

Related U.S. Application Data

[62] Division of Ser. No. 378,750, Jan. 26, 1995.

[51] Int. Cl.$^6$ .............................. H01L 29/41; H01L 29/43
[52] U.S. Cl. .......................... 257/751; 257/757; 257/761; 257/768
[58] Field of Search .................... 257/751, 763, 257/764, 915, 753, 757, 761, 383, 384, 768, 382

[56] References Cited

U.S. PATENT DOCUMENTS

| | | | |
|---|---|---|---|
| 4,502,209 | 3/1985 | Eizenberg et al. | 357/71 |
| 4,640,004 | 2/1987 | Thomas et al. | 357/71 |
| 4,782,380 | 11/1988 | Shankar et al. | 357/71 |
| 4,804,636 | 2/1989 | Groover, III et al. | 437/52 |
| 4,888,297 | 12/1989 | Aboelfotoh et al. | 437/41 |
| 4,912,543 | 3/1990 | Neppl et al. | 357/67 |
| 4,926,237 | 5/1990 | Sun et al. | 257/765 |
| 4,981,550 | 1/1991 | Huttemann et al. | 156/643 |
| 5,066,615 | 11/1991 | Brady et al. | 437/229 |
| 5,135,878 | 8/1992 | Bartur | 437/39 |
| 5,142,438 | 8/1992 | Reinberg et al. | 437/52 |
| 5,231,055 | 7/1993 | Smith | 437/203 |
| 5,240,880 | 8/1993 | Hindman et al. | 437/190 |
| 5,275,715 | 1/1994 | Tuttle | 437/192 |
| 5,278,099 | 1/1994 | Maeda | 437/192 |
| 5,281,838 | 1/1994 | Okumura et al. | 257/756 |
| 5,312,772 | 5/1994 | Yokoyama et al. | 437/190 |
| 5,341,016 | 8/1994 | Prall et al. | 257/412 |

FOREIGN PATENT DOCUMENTS

| | | | |
|---|---|---|---|
| 0269211 | 6/1988 | European Pat. Off. | 257/762 |
| 0431721 | 6/1991 | European Pat. Off. | 257/754 |

OTHER PUBLICATIONS

Kolawa, Elzbieta; Halperin, Louis E., Vu, Quat; Nicolet, Marc–A; "Amorphous Ternary Thin–Film Alloys as Diffusion Barriers in Silicon Metallizations," pp. 243–247; California Institute of Technology; 1990.

Kwok, C.–K., Kolawa, E., Nicolet, M–A., Lee, Ray L.; "Stress and Resistivity in Reactively Supttered Amorphous Metallic Ta–Si–N Films"; California Institute of Technology. 1991.

Kolawa, E., Molarius, C. W. Nieh, M.–A. Nicolet, "Amorphous Ta–Si–N thin–film alloys as diffusion barrier in Al/Si metallizations;" pp. 3006–3010, J. Vac. Sci. Technol. A8 (3); American Vacuum Society; May/Jun. 1990.

Reid, J. S., Kolawa, E., Ruiz, P., Nicolet, M–A, "Evaluation of amorphous (Mo, Ta, W)—Si–N diffusion barriers for <Si> cu metallizations," pp. 319–324, California Institute of Technology, Pasadena, California.

*Primary Examiner*—Peter Toby Brown
*Attorney, Agent, or Firm*—Hickman Beyer & Weaver

[57] ABSTRACT

A method for manufacturing an ohmic contact on a semiconductor device, as disclosed herein, includes a first step of etching a via through a non-conductive layer formed over a partially fabricated version of the semiconductor device. This step exposes a region of a device element such as a source, gate electrode, etc. Next, an ohmic contact layer including tantalum and silicon is deposited over the partially fabricated device and in the vias by sputtering in an argon atmosphere. Thereafter, and in the same processing apparatus, a barrier layer including a tantalum silicon nitride is deposited over the ohmic contact layer. Then an aluminum alloy metallization layer is directly deposited on the partially fabricated device at a temperature of at least 650° C. At this deposition temperature, the metallization layer conformally fills the via, thereby producing a stable, uniform contact.

12 Claims, 7 Drawing Sheets

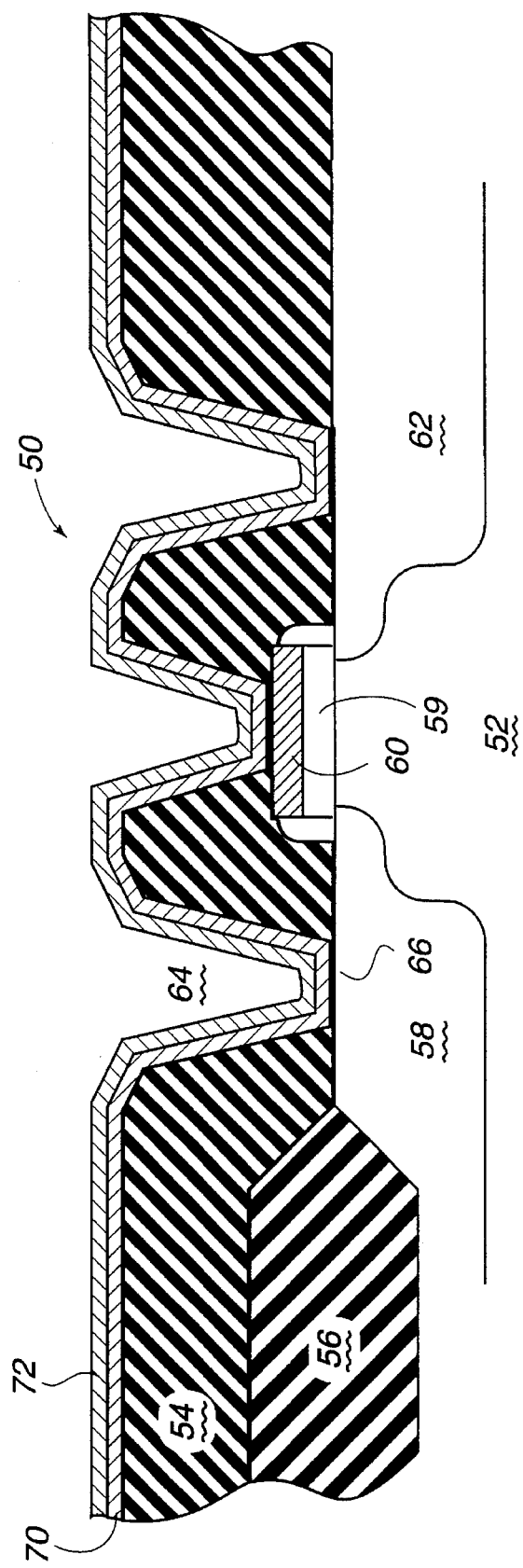

RELIABLE METALLIZATION WITH BARRIER FOR SEMICONDUCTORS

This is a divisional of copending application Ser. No. 08/378,750 filed on Jan. 26, 1995.

BACKGROUND OF THE INVENTION

The present invention relates generally to methods of forming ohmic contacts between metallization layers and device elements in semiconductor devices. More particularly, the invention relates to methods of forming contacts that include tantalum-containing barrier layers.

In the manufacture of integrated circuits, a conductive metal, such as aluminum or an aluminum alloy, is typically used to form the interconnections or "wiring" between the various semiconductor devices making up the chip. More specifically, the interconnections are electrically conductive paths between various device elements of the devices making up the integrated circuit. Each such device element must make an ohmic contact with an interconnection. In the case of MOS-based integrated circuits, device elements requiring ohmic contacts to metal interconnects include sources, drains, and gate electrodes. In addition, the well regions in which MOS devices are formed generally require ohmic contacts to metal interconnections.

Herein the process of depositing the conductive metal, along with any other corresponding steps, is termed "contact metallization" or simply "metallization". Once deposited, the conductive metal layer is called a "metallization layer".

In the fabrication of integrated circuits, after the device elements are formed on a semiconductor substrate, an insulating or dielectric "blanket" layer is deposited over the substrate, thereby covering any device elements which require electrical connection. Thereafter, to enable electrical connection to these devices, interconnect regions, called "contact vias" or simply "vias", are etched through the blanket layer and expose portions of the device elements. After a few intervening steps (discussed below), a metallization layer is deposited. To successfully form ohmic contacts, the metallization layer (or some other electrically conductive material) must extend down into and conformally fill the contact vias. Otherwise gaps may remain in the via and prevent reliable electrical contact. Thus, the process steps and conditions must be conducted under conditions which provide adequate filling of the vias.

Between the step of forming vias in the insulating blanket layer and the step of depositing a metallization layer, a diffusion barrier is formed over the top of the insulating layer. This is to prevent species from the metallization (often copper present in the aluminum metallization) from diffusing into the substrate and degrading device performance. Thus, diffusion barriers are made from materials which prevent diffusion while still allowing good electrical contact between the metallization layer and the substrate.

A conventional process for forming a contact to an MOS source will now be described with reference to FIG. 1. Beginning with a partially fabricated MOS device, a silicon substrate 20 includes a source region 22, a gate electrode 24, and a drain region 26. A field oxide region 28, located adjacent to the source region, partially covers the silicon substrate 20 and electrically isolates adjacent devices. Initially, a non-conductive blanket layer 30 comprised of a low temperature oxide/borophosphorous glass is conformally deposited on substrate 20. Next, a via is etched through the blanket layer 30, thereby exposing a portion of the source region 22. It should be noted that in actual processes, vias are simultaneously formed over gates, drain regions, source regions, and well regions. To simplify illustration, however, only the source region via will be shown. After the via has been formed, a titanium (Ti) layer 32 is conformally deposited over the structure. Thereafter, a titanium nitride (TiN) barrier layer 33 is conformally deposited over Ti layer 32. Next, the MOS device is subjected to a rapid thermal anneal (RTA) step to cause some Ti from the Ti layer to diffuse into source region 22 and form a titanium silicide ohmic contact 31.

Following the RTA, a blanket layer of Tungsten (W) is deposited over the partially fabricated chip at a temperature typically about 450° C. followed by an etchback process removing all the blanket W layer except a plug 34. Next, a second TiN barrier layer 36 is deposited over the tungsten filled via 34. At this point, the upper surface of the structure is relatively flat and contains no unfilled vias. On this surface, an aluminum metallization layer 38 is now deposited, overlying the second barrier layer 36. The temperature of this deposition step is conventionally about 275–300° C. As explained below, at this temperature, the aluminum metallization layer is unable to conformally fill the vias. Thus, tungsten is used to conformally fill the vias and provide a relatively flat surface for metallization. Of course, this results in increased process complexity. Specifically, between the steps of forming barrier layers 33 and 36, the partially fabricated chip must be transferred to different processing equipment to form the tungsten layer. In a final step, an antireflective TiN layer 40 is deposited over the metallization layer 38 to facilitate subsequent photolithographic patterning of layer 38 to form lines.

In the above method, the processing temperature is maintained below about 600–650° C. Beyond this temperature range, the barrier properties of TiN degrade and diffusion between the substrate 20 and the W plug 34 begin to become significant. Thus, the aluminum metallization layer is deposited at the relatively low temperature of 275–300° C. As noted, this is too low to allow the aluminum metallization to conformally fill the vias. In addition, aluminum deposited at this temperature cannot form a planar upper surface, thus requiring a subsequent polishing or other planarization step.

In discussing the size of vias, often a parameter called the "minimum step coverage" determines the smallest allowable via. FIG. 2 ("prior art") provides a cross-sectional illustration of a contact produced by depositing a metallization layer in a via and will serve as an example for explaining the term minimum step coverage. In this example, the substrate 10 is covered by a non-conductive passivation layer 12, a diffusion barrier layer 16, and a metallization layer 18. As shown, the metallization layer 18 fails to completely fill the via. Instead, the metallization layer 18 covers the barrier layer 16 but leaves an empty pocket 19 within the via.

The step coverage for this example (and in general) is found by first dividing a lateral dimension $\Delta$ (which is the thickness of the metallization layer within the via) by a longitudinal dimension $\beta$ (which is the thickness of the metallization layer outside of the via). This factor, $\beta/\Delta$, is then multiplied by 100 to yield a number which is by definition the step coverage. If the step coverage for the contact is less than the predetermined minimum step coverage, then this contact is defective. That is, the contact will almost certainly fail, even if it conducts initially. This problem is now addressed by using tungsten plugs which conformally deposit in smaller vias at low temperatures.

Present manufacturing processes attain a minimum via size of perhaps 0.4 microns in the lateral direction (Please note that this number is given primarily as a reference point for the following discussion). However, there is a continuing demand for increased semiconductor device packing density. This demand can only be met by decreasing the sizes of all components in the semiconductor device. Accordingly, the size of the vias interconnecting these components has continually decreased (and will continue to do so). Thus, vias having a minimum size of less than 0.4 microns will be required in future generations of integrated circuits. Furthermore, any other improvements over the current manufacturing process, such as fewer and/or simpler processing steps, will provide the user of the improved technology a competitive advantage.

In view of the above, it is apparent that an improved process for forming ohmic contacts in integrated circuits is required. Such process should be less complex than the conventional processes employing tungsten plugs. In addition, the improved process should be able to meet the demands of next generation integrated circuits which will require smaller vias.

SUMMARY OF THE INVENTION

The present invention meets the aforementioned requirements by providing a process employing a tantalum silicon nitride barrier layer. This material effectively blocks diffusion between the semiconductor substrate and the metallization layer at significantly higher temperatures than titanium nitride. Thus, the metallization layer can be deposited at temperatures high enough that the metal conformally fills the vias. In general, the invention produces stable, uniform contacts in fewer process steps and with fewer pieces of machinery. Specifically, the contacts can be formed without depositing a layer of tungsten. Further, the invention allows formation of ohmic contacts in smaller vias than is permitted with conventional processes.

A semiconductor device in accordance with one aspect of the present invention includes a substrate, a non-conductive layer which partially covers a device element found in the substrate, a via extending through the nonconductive passivation layer thereby exposing a region of the device element, an ohmic contact layer, a barrier layer, and a metallization layer. The ohmic contact layer includes tantalum and silicon and the barrier layer includes a tantalum silicon nitride. The ohmic contact layer, the barrier layer, and the metallization layer are all formed over and in electrical contact with the exposed region of the device element. The tantalum silicon nitride barrier layer substantially prevents diffusion between the device element and the metallization layer.

Another aspect of the present invention provides a method for manufacturing a semiconductor device as described above. This method begins with a substrate having at least one device element to which electrical contact is to be made, and a non-conductive layer covering the device element. Initially, a via is etched extending through the non-conductive layer thereby exposing a region of the device element found in the substrate. Next, two layers, an ohmic contact layer including tantalum and silicon and a barrier layer including a tantalum silicon nitride, are deposited upon the semiconductor device such that each layer is formed over and in electrical contact with the exposed region of the device element.

Once the ohmic contact layer and the barrier layer are deposited on the semiconductor, a metallization layer is directly deposited over these layers. In a preferred embodiment, the metallization layer is aluminum or an aluminum containing alloy, and is deposited at a temperature of at least about 650° C. At this temperature, the metallization layer conformally fills the via, thereby producing a stable, uniform contact. Further, this method is expected to attain contacts within vias having sizes in the range of about 0.2–0.5 microns.

In especially preferred embodiments, the aforementioned ohmic contact layer, barrier layer, metallization layer, and an additional, anti-reflective, layer are all generated in a single metal deposition system employing the same processing equipment. As a result, the cycle time for manufacturing the semiconductor device is reduced. Further, the processing equipment is less expensive. In short, the present invention is a simple, inexpensive, and effective method of forming ohmic contacts to semiconductor devices.

BRIEF DESCRIPTION OF THE DRAWINGS

FIG. 3c is a cross-sectional view of a semiconductor device of the present invention after deposition of the tantalum silicide ohmic contact layer and the tantalum silicon nitride barrier layer prior to metallization;

DESCRIPTION OF THE PREFERRED EMBODIMENTS

Figure 3A:
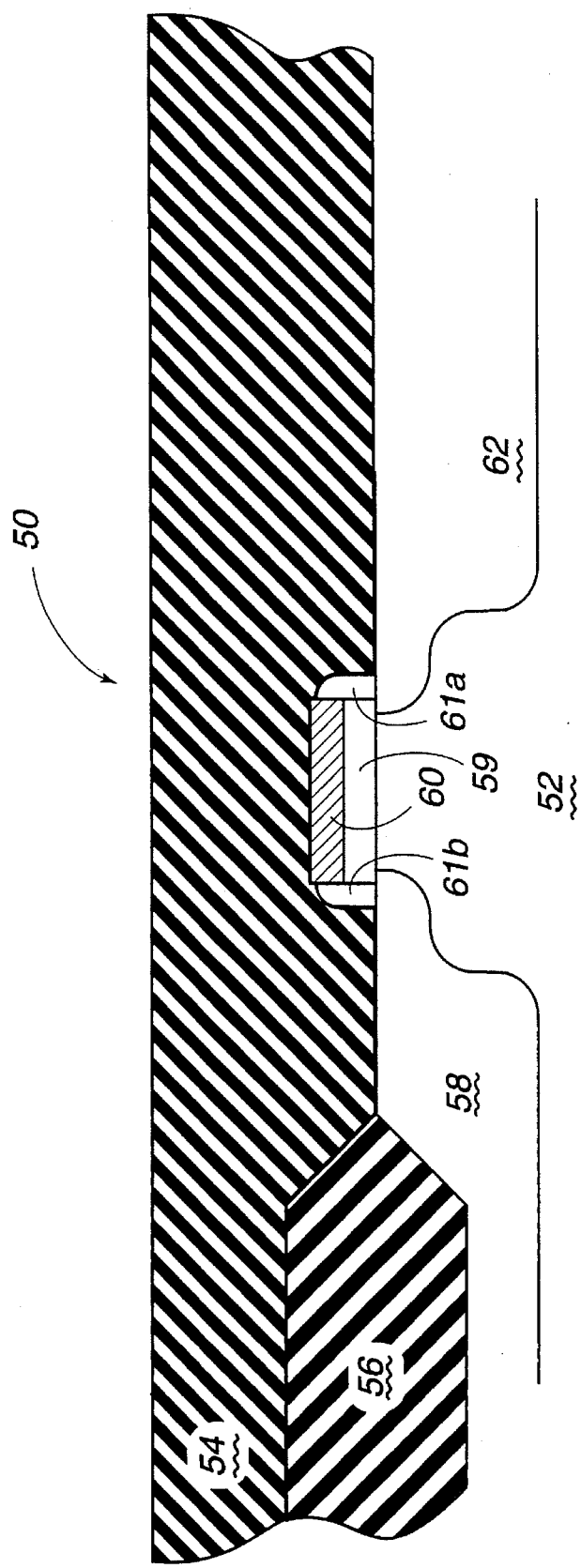
FIG. 3a is a cross-sectional view of a semiconductor device of the present invention prior to the contact etch.

A preferred embodiment of the present invention will be described with reference to FIGS. 3a–3e. The process begins with a partially fabricated semiconductor device (an MOS device in an integrated circuit in this example) as shown in FIG. 3a. The partially fabricated device includes a semiconductor substrate 52 on which are formed a source 58 and a drain 62. The region of the semiconductor substrate in which the source and drain are formed is typically lightly doped and known as a well. A field oxide layer 56 is grown on the substrate 52 to electrically isolate adjacent devices on the integrated circuit. The partially fabricated device also includes a gate electrode 60 and a gate oxide 59 which are straddled by spacers 61a and 61b. Finally, the device includes a non-conductive layer 54 which may be any of a number of conventional dielectric materials including oxides and glasses such as a low temperature oxide borophosphorous silicate glass (LTO/BPSG). These elements are formed in a well region. Those of skill in the art will understand that the structure shown in FIG. 3a may be formed by conventional processes.

To simplify the description, the process will be described with respect to the source 58 only. However, it should be understood that the process applies to all device elements requiring electrical contact with a metallization layer. In fact, it is expected that the process described herein typically will be employed to form all contacts between device elements and a first metallization layer on an integrated circuit.

Figure 3B:
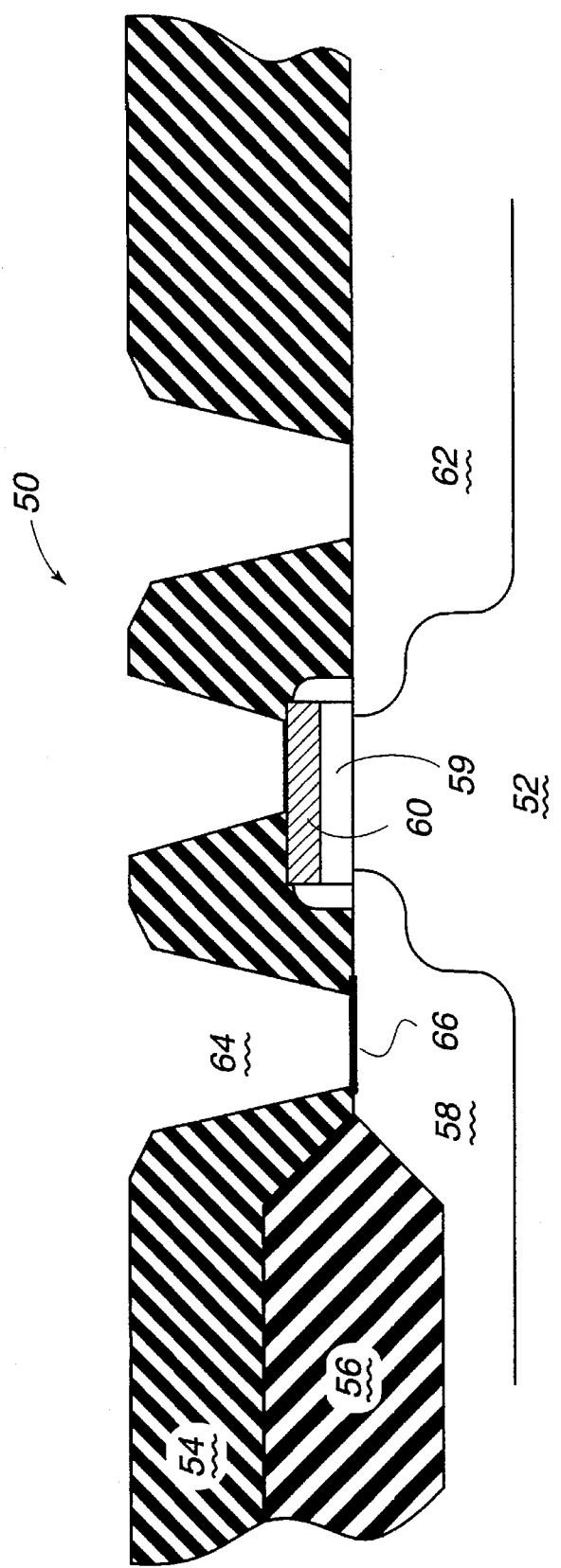
FIG. 3b is a cross-sectional view of a semiconductor device of the present invention after the contact etch.

FIG. 3b is a cross sectional view of the semiconductor device of the present invention following a conventional etching step. In this step, contact vias, such as via 64, are etched through the non-conductive layer 54 down to the level of the substrate surface at a device element. As shown, via 64 provides an exposed region 66 of source 58 which enables electrical contact between the source 58 and the other layers which will be deposited in subsequent steps. As is known in the art, vias can be formed by various etching processes (e.g., a wet etch with dilute HF or a dry plasma etch), and the actual process employed is not particularly relevant to the present invention.

FIG. 3c is a cross-sectional view of the semiconductor device of the present invention after a step involving deposition of ohmic contact and barrier layers. First an ohmic contact layer 70 is deposited overlying the exposed region of the source. The ohmic contact layer 70 includes tantalum and silicon and may form a tantalum silicide having a thickness between about 200–1500 Å, and more preferably between about 500–800 Å. Next, preferably in the same deposition system, a barrier layer 72 is deposited overlying the ohmic contact layer 70. The barrier layer 72 includes a tantalum silicon nitride having a thickness between about 200–1500 Å, and more preferably between about 500–800 Å. Both the ohmic contact layer 70 and the barrier layer 72 are formed over and in electrical contact with the exposed region 66.

In a preferred embodiment of the present invention, deposition of the ohmic contact layer 70 is performed by reactive sputtering of a $Ta_5Si_3$ target in an argon plasma. Thereafter, deposition of the barrier layer 72 is performed by reactive sputtering of the same $Ta_5Si_3$ target in an $N_2/Ar$ plasma. Thus both layers can be prepared within the same deposition system employing the same processing equipment. Initially, the process is conducted in an argon atmosphere (to form the ohmic contact layer), and then when the ohmic contact layer is sufficiently thick, $N_2$ is introduced into the reaction chamber to form an $Ar/N_2$ atmosphere. At that point, the deposited layer becomes a tantalum silicon nitride.

Suitable deposition conditions and equipment are widely used in the field of semiconductor manufacturing, and will be apparent to those of skill in the art. By way of example, the sputtering chamber can have a base pressure between about $1\times10^{-7}$ and $8\times10^{-7}$ Torr, an operating temperature between about 450° and 500° C., and the sputtering source can be a 7.5 cm diameter, 300 W RMS magnetron cathode situated 9 cm above the substrate. Applicable deposition conditions and processing equipment are discussed in an article by Reid et al., "Evaluation of amorphous (Mo, Ta, W)—Si—N diffusion barriers for Si|Cu metallizations", Thin Solid Films, 236, pp. 319–324 (1993).

Depending upon the process conditions employed, the exact stoichiometry of the ohmic contact and barrier layers may vary. It appears that suitable layers will have the following stoichiometric ratios: (1) in the range of $Ta_{74}Si_{26}$ for the ohmic contact layer 70, and (2) in the range of $Ta_{36}Si_{14}N_{50}$ for the barrier layer 72. Particularly preferred barrier layers will have highly amorphous structures.

At this point in the process, the partially fabricated semiconductor device is prepared for metallization. In some embodiments, however, a rapid thermal anneal (RTA) may be employed at this point. As noted, RTAs are performed in conventional titanium based technologies to drive some titanium from a titanium silicide ohmic contact layer into the underlying device element to form an ohmic contact. In the present invention, an RTA step would drive some tantalum into the device element to form a local region of increased tantalum concentration. The increased tantalum concentration would provide an effective ohmic contact with the ohmic contact layer 70. In preferred embodiments, the RTA step will not be necessary because, as explained below, the subsequent metallization step is conducted at a sufficiently high temperature to automatically form an ohmic contact (by causing some tantalum to diffuse from the ohmic contact layer into the underlying device element). Prior art metallization processes, conducted at lower temperatures, provided insufficient driving force to cause titanium to diffuse into the device elements. Thus, a separate RTA step was generally required.

A particularly noteworthy feature of the tantalum silicon nitride barrier layer 72 is its ability to effectively block diffusion between the substrate and a metallization layer at processing temperatures up to at least about 900° C. It is believed that the tantalum silicon nitride is such an effective diffusion barrier because it maintains a highly amorphous structure even at such high temperatures. In general, polycrystalline barrier layers have grain boundaries which serve as potential pathways for copper or other species to migrate through to reach the semiconductor substrate. Thus, it is generally recognized that amorphous barrier layers generally are more effective than their crystalline counterparts.

Figure 3D:
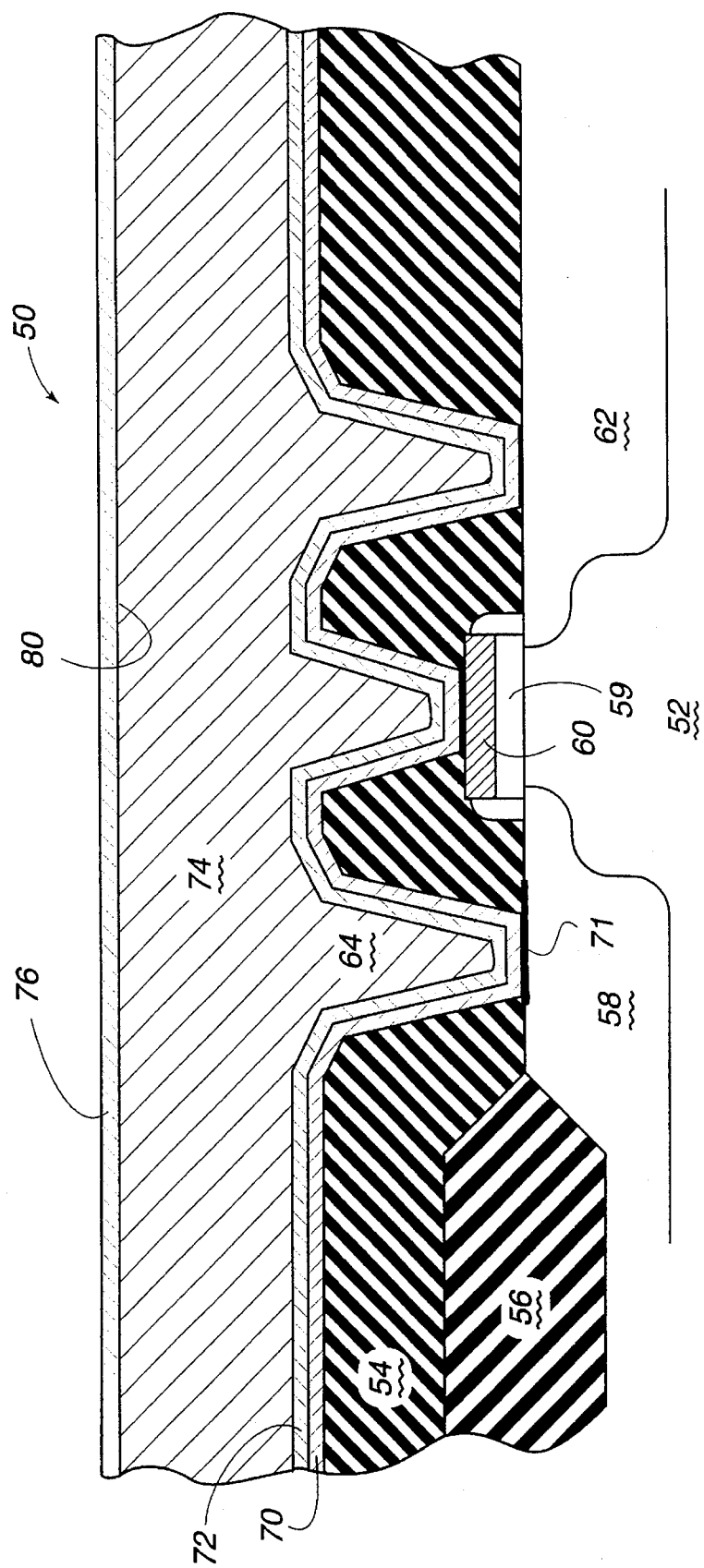
FIG. 3d is a cross-sectional view of a semiconductor device of the present invention after deposition of the metallization layer and reflow at high temperature.

FIG. 3d is a cross-sectional view of the semiconductor device of the present invention following the metallization step. In this step, a metallization layer 74 is conformally deposited directly on top of the barrier layer 72. Because the metallization layer must fill the vias (in place of the tungsten plugs employed in conventional processes), it is formed under conditions which completely fill the via and thereby provide good electrical contact with the underlying device component. Typically, the metallization layer 74 includes aluminum or an aluminum alloy (such as those containing copper) and has a thickness between about 0.5–1 microns. Of course, as device sizes shrink, thinner layers may be appropriate.

Figure 1:
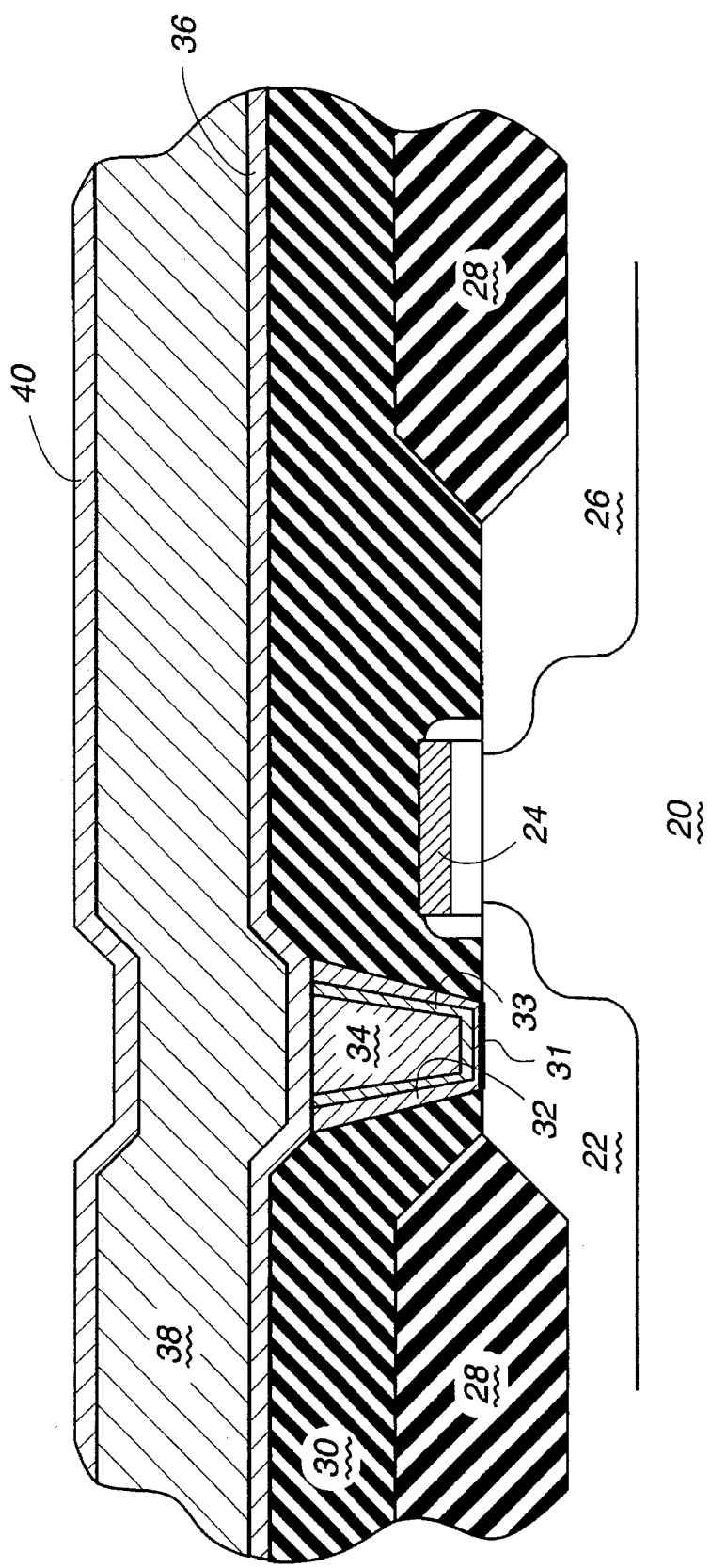
FIG. 1 is a cross-sectional view of the prior art multi-step contact metallization using a silicide layer, a titanium layer, a tungsten blanket, and multiple titanium nitride layers.
Figure 2:
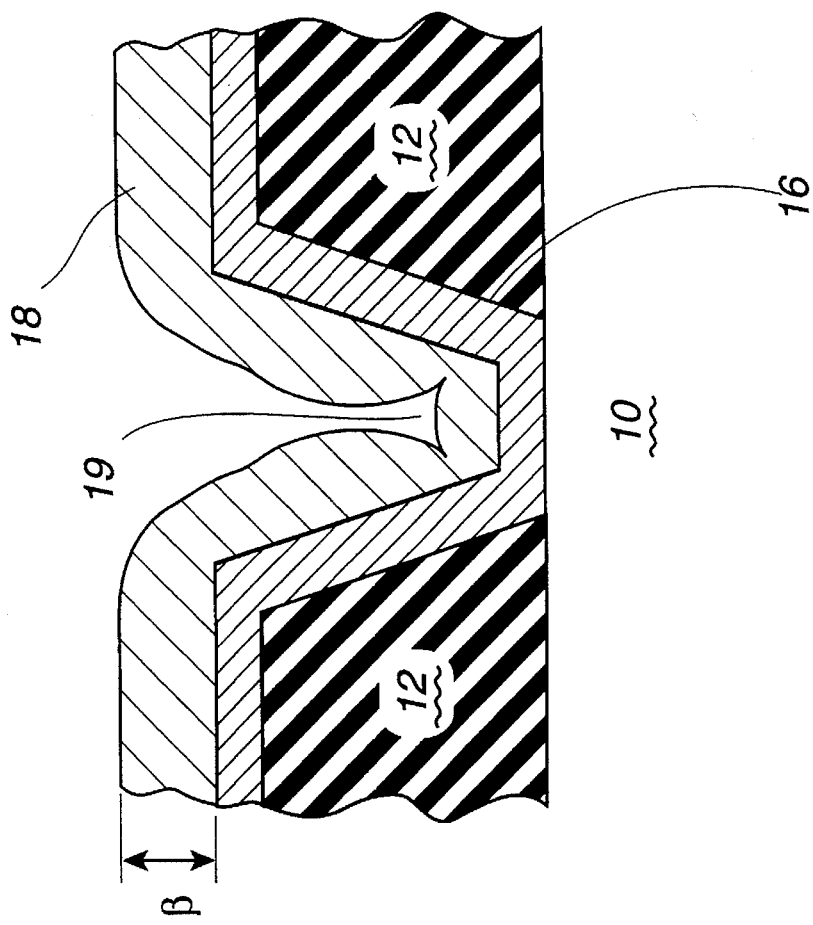
FIG. 2 is a cross-sectional view of a potentially unstable contact of the prior art in which the minimum step coverage is a critical factor.

To ensure that the metallization layer completely fills the vias, it is performed at a sufficiently high temperature to ensure the metallization material deposits conformally without gaps such as those shown in FIG. 2. For example, the process temperature employed to deposit an aluminum alloy metallization layer is at least about 550° C., and preferably at least about 650° C. Because such temperatures are close to the melting point of aluminum (673° C.), the metallization layer 74 tends to flow somewhat during deposition and, as a result, the product 50 has two important characteristics. First, the metallization layer conformally fills the via 64, thereby producing a stable, uniform contact. More specifically, the via may be as small as 0.2 microns, a fifty percent reduction in size when compared to current manufacturing practices. Second, the metallization layer has a planar upper surface 80. Thus, the high temperature metallization deposition of this invention eliminates the need for both a W plug and an additional surface planarization step. Still further, the process is conducted at a sufficiently high temperature that some tantalum will diffuse from ohmic contact layer 70 into the underlying substrate, thereby eliminating the requirement for an RTA step to form an ohmic contact region 71.

It should be appreciated that the metallization process for the present invention can be performed at even higher temperatures (theoretically up to 900° C.) because the tantalum silicon nitride barrier layer effectively limits diffusion at higher temperatures. This is in contrast to a titanium nitride layer which begins to allow significant diffusion at temperatures of about 650° C.

The partially fabricated device shown in FIG. 3d includes an antireflective layer 76 deposited on top of the metallization layer 74. The material chosen for the anti-reflective layer 76 can be any one of many well known materials. In a preferred embodiment, anti-reflective layer 76 is a tantalum silicon nitride prepared by reactive sputtering of a $Ta_5Si_3$ target in an $N_2$/Ar plasma (in the same or similar apparatus and conditions as employed to deposit barrier layer 72). The anti-reflective layer is preferably deposited to a thickness of between about 500–800 Å.

Typically, the product shown in FIG. 3d will undergo additional processing to produce a completed integrated circuit chip. Specifically, the metallization layer 76 will be patterned to form conductive lines connecting device elements of various transistors to partially form gates, etc. Next, another insulating layer will be deposited over the entire product and etched to form vias. Then a second metallization layer will be deposited and patterned to form additional interconnections between devices and complete circuits. Additional processing and packaging are then performed to produce the final IC chip.

Figure 3E:
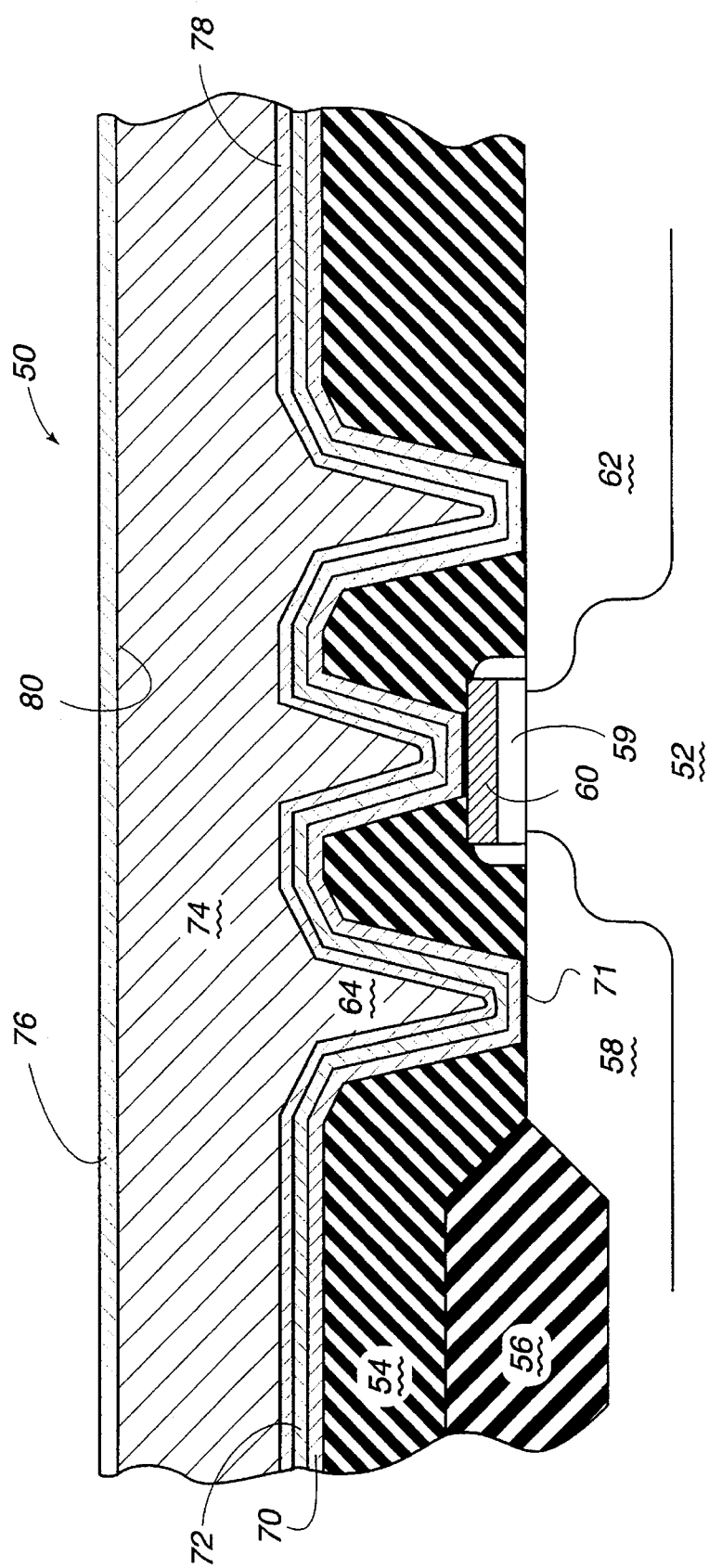
FIG. 3e is a cross-sectional view of a semiconductor device of another embodiment of the present invention including deposition of a wetting layer.

An alternative embodiment of the present invention is shown in FIG. 3e. In this embodiment, a "wetting" layer 78 is deposited to ensure good contact (i.e., effective wetting) between metallization layer 74 and the walls of the vias. Thus; wetting layer 78 is deposited overlying the barrier layer 72 prior to deposition of the metallization layer 74. The wetting layer 78 may be necessary in processes where the metal deposition conditions do not ensure that the metallization layer will adequately fill the vias (i.e., where gaps such as those shown in FIG. 2 are a possibility). In a preferred embodiment, the ohmic contact layer 70, the barrier layer 72, the wetting layer 78, the metallization layer 74, and the anti-reflective layer 76 are all formed with the same deposition system (employing the same processing equipment).

Although two embodiments of the present invention have been described in detail, it should be understood that the present invention may be embodied in many other specific forms without departing from the spirit or scope of the invention. Particularly, it should be understood that the exact sizing, shaping, and placement of the various components may be widely varied within the scope of the present invention. Further, the exact material compositions can be varied somewhat and still provide good contacts within the scope of this invention. For example, the stoichiometries of the ohmic contact and barrier layers may be modified somewhat without departing from this invention. Still further, although the invention was described in terms of an MOS device, there is no reason, in theory, why it could not be applied to other types of silicon devices such as silicon on insulator (SOI) devices.

Therefore, the present examples and embodiments are to be considered as illustrative and not restrictive, and the invention is not to be limited to the details given herein, but may be modified within the scope of the appended claims.

What is claimed is:

1. An semiconductor device comprising:

a substrate having at least one device element;

a non-conductive layer at least partially covering said device element;

a via extending through said non-conductive layer to said device element thereby providing an exposed region of said device element;

an ohmic contact layer including tantalum and silicon, said ohmic contact layer formed over at least a first portion of said non-conductive layer and said via, said ohmic contact layer being in electrical contact with said exposed region;

a barrier layer including an amorphous tantalum silicon nitride, said barrier layer formed over at least a second portion of said non-conductive layer and said via, said barrier layer directly contacting said ohmic contact layer, and being in electrical contact with said exposed region; and a metallization layer overlying said semiconductor device and in electrical contact with said exposed region, wherein said barrier layer substantially prevents diffusion between said device element and said metallization layer.

2. A semiconductor device as recited in claim 1 wherein said metallization layer includes aluminum or an aluminum containing alloy.

3. A semiconductor device as recited in claim 1 further comprising an anti-reflective layer formed over said metallization layer.

4. A semiconductor device as recited in claim 1 wherein said ohmic contact layer is between about 500–800 Å thick.

5. A semiconductor device as recited in claim 1 wherein the ohmic contact layer is prepared by reactive sputtering of a tantalum-silicon target in an Ar plasma.

6. A semiconductor device as recited in claim 1 wherein said barrier layer is between about 500–800 Å thick.

7. A semiconductor device as recited in claim 1 wherein said barrier layer is prepared by reactive sputtering of a tantalum-silicon target in an $N_2$/Ar plasma.

8. A semiconductor device as recited in claim 2 wherein said metallization layer has a planar upper surface.

9. A semiconductor device as recited in claim 3 wherein said anti-reflective layer includes tantalum silicon nitride.

10. A semiconductor device as recited in claim 3 wherein said ohmic contact layer, said barrier layer, said metallization layer, and said anti-reflective layer are generated in a single metal deposition system employing the same processing equipment.

11. A semiconductor device as recited in claim 1 wherein said semiconductor device is a metal-oxide-semiconductor (MOS) device and said device element is selected from the group consisting of a source, a drain, a well and a gate.

12. A semiconductor device as recited in claim 1 wherein said non-conductive layer includes a low temperature oxide borophosphorous silicate glass (LTO/BPSG).

* * * * *